United States Patent [19]
Stefani et al.

[11] Patent Number: 5,399,229
[45] Date of Patent: Mar. 21, 1995

[54] SYSTEM AND METHOD FOR MONITORING AND EVALUATING SEMICONDUCTOR WAFER FABRICATION

[75] Inventors: Jerry A. Stefani, Richardson; Stephanie W. Butler, Plano, both of Tex.

[73] Assignee: Texas Instruments Incorporated, Dallas, Tex.

[21] Appl. No.: 61,983

[22] Filed: May 13, 1993

[51] Int. Cl.6 .................. H01L 21/306; B44C 1/22
[52] U.S. Cl. .................................. 156/626; 156/643; 156/657; 156/662; 156/345
[58] Field of Search ............... 156/626, 627, 643, 653, 156/657, 659, 662, 345; 437/8; 204/192.33, 298.32; 356/138, 139, 381, 345, 357, 445, 222

[56] References Cited

U.S. PATENT DOCUMENTS

| | | | |
|---|---|---|---|
| 4,948,259 | 8/1990 | Enke et al. | 356/382 |
| 5,091,320 | 2/1992 | Aspnes et al. | 437/8 |
| 5,166,752 | 11/1992 | Spanier et al. | 356/369 |
| 5,197,018 | 3/1993 | Oh | 364/508 |
| 5,200,919 | 4/1993 | Kaya | 365/185 |
| 5,220,405 | 6/1993 | Barbee et al. | 356/357 |
| 5,232,537 | 8/1993 | Yachi | 156/345 |
| 5,270,222 | 12/1993 | Moslehi | 437/8 |
| 5,293,216 | 3/1994 | Moslehi | 356/371 |

OTHER PUBLICATIONS

Ruey-Shan Guo and Emanuel Sachs, "Modeling, Optimization and Control of Spatial Uniformity in Manufacturing Processes," *IEEE Transactions on Semiconductor Manufacturing*, vol. 6, No. 1, Feb. 1993, pp. 41–57.
Demetre Economou, et al., "In Situ Monitoring of Etching Uniformity in Plasma Reactors," *Solid State Technology*, Apr. 1991, pp. 107–111.
Joseph C. Davis, et al., "Application of Modern Quality Improvement Techniques to Rapid Thermal Processing," *North Carolina State University*, Department of Statistics.

*Primary Examiner*—William Powell
*Attorney, Agent, or Firm*—Douglas A. Sorensen; Richard L. Donaldson; William E. Hiller

[57] ABSTRACT

A system (60) and method for monitoring, evaluating and controlling the uniformity of a semiconductor wafer fabrication process is provided for use in manufacturing integrated circuits on semiconductor wafers (40). By using in situ ellipsometry (20) in conjunction with statistical modeling methods, the spatial etch rate pattern across a semiconductor wafer (40) may be inferred as a function of the process conditions. A predicted mean etch rate may be calculated for other locations (46 and 48) on the semiconductor wafer surface (42) by using the mean etch rate measured at the selected ellipsometer site (44) and individual spatial etch rate models developed for each site (44 and 48) based on statistically designed experiments. The predicted mean etch rate at the other sites (46 and 48) is also a function of the fabrication process conditions. The method for evaluating uniformity may be used with fabrication processes such as oxidation, doping, etching or any other process which may be measured in situ at a selected location (44) on a semiconductor wafer (40) during the fabrication process.

23 Claims, 2 Drawing Sheets

SYSTEM AND METHOD FOR MONITORING AND EVALUATING SEMICONDUCTOR WAFER FABRICATION

NOTICE

The United States Government has a paid-up license in this invention and the right in limited circumstances to require the patent owner to license others on reasonable terms as provided for by the terms of Contract No. F33615-88-C-5448 awarded by the Air Force Wright Laboratory and the DARPA Microelectronics Technology Office.

TECHNICAL FIELD OF THE INVENTION

This invention relates to integrated circuits, and more particularly relates to monitoring and evaluating uniformity of semiconductor wafer fabrication processes.

BACKGROUND OF THE INVENTION

Various processes and procedures are used to fabricate integrated circuits on semiconductor wafers. Examples of these processes include oxidation of silicon to form a silicon dioxide ($SiO_2$) film on a silicon substrate and microlithography which generally involves placing a radiation sensitive material (sometimes referred to as a "photoresist" or "resist") on the oxide film. Structural features of the integrated circuit are frequently developed on the wafer by either depositing material, oxidation, or removing the underlying material (etching). Typically, the resist is radiated through a mask placed over the resist by lithography techniques such as photolithography, electron beam lithography or x-ray lithography. The resist reacts chemically in the exposed areas of the mask depending upon the choice of the chemical system.

Other processes commonly associated with semiconductor wafer fabrication include diffusion of controlled impurities or dopants into the films. Ion implantation is also used to introduce controlled impurities into the films. Additional fabrication processes include physical vapor deposition of thin films by sputtering and physical vapor deposition of thin films by evaporation.

The sequence of wafer fabrication processes and procedures are selected depending upon the type of semiconductor wafer and the desired operating characteristics of the integrated circuit which will be fabricated on the semiconductor wafer. Fabrication processes are frequently repeated several times to build up multiple layers associated with modern very large scale integrated circuits which are fabricated on semiconductor wafers.

Etching is a commonly used process in the fabrication of many integrated circuits on semiconductor wafers having a silicon substrate. Etching involves removal of material from the silicon substrate and/or selected thin film layers which were previously deposited on the surface of the silicon substrate. When a mask is used to protect portions of the wafer surface, the goal of etching is to remove material which is not covered by the mask. The primary objective of the etching process is to precisely transfer the pattern established by the protective mask onto the underlying material.

Various techniques such as ellipsometry are used to measure film thickness on semiconductor wafers. Ellipsometry also measures the optical index of refraction. Ellipsometry techniques are frequently used to measure the thickness and index of refraction of various types of dialectic films and also determine the thickness of multiple layer film structures such as polysilicon on silicon dioxide or a photoresist on silicon dioxide. Other techniques for determining film thickness include optical interference, capacitance methods and/or oxide film color charts.

SUMMARY OF THE INVENTION

In accordance with the present invention, disadvantages and problems associated with previous monitoring and evaluating systems used during semiconductor wafer fabrication have been substantially reduced or eliminated. The present invention allows monitoring a fabrication process at a selected site on a semiconductor wafer and reliably predicting the results of the fabrication process at other sites on the semiconductor wafer.

The present invention allows a fabrication process to be monitored in situ at a selected location on a semiconductor wafer and to reliably predict the results of the fabrication process at other locations on the semiconductor wafer as a function of information obtained at the selected location and process conditions or control factors. With proper modeling and specification of the process conditions or control factors, real-time evaluation of a fabrication process across the full wafer surface is now available.

In accordance with one aspect of the present invention, statistical modeling methods are combined with in situ ellipsometry to provide real time evaluation of spatial etch rate patterns across the surface of a semiconductor wafer as a function of selected process conditions during a single wafer plasma etch fabrication process. By providing real time evaluation of the etch rate at other sites or locations across the surface of the wafer, variations between wafers fabricated in the same reactor vessel with the same process are substantially reduced by providing enhanced run-to-run control.

An important technical feature of the present invention is reducing surface damage and achieving desired vertical profiles during selective etching of polysilicon, The present invention provides improved process control to enhance uniformity of the polysilicon layer across the surface of a semiconductor wafer during the bulk etching process, The present invention provides information to achieve optimum, uniform thickness of a polysilicon layer after completion of the bulk etch process, The present invention also controls etch uniformity on a wafer to wafer basis.

Another important technical feature of the present invention includes taking information obtained from a sensor monitoring one location on the surface of a semiconductor during a fabrication process and using the information to provide real time evaluation of the results of the process at any other desired location on the surface of the semiconductor wafer. Information provided by the sensor may be used to control and/or stop the fabrication process when inferred values at other locations on the surface of the semiconductor wafer indicate a desired level of uniformity across the wafer surface.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1 through 6 of the drawings, like numerals being used for like and corresponding parts of the various drawings.

Various processes such as oxidation, diffusion, ion implantation, chemical vapor deposition and etching are used during the fabrication of an integrated circuit on a semiconductor wafer. Also, various types of in situ sensors such as interferometers, infrared spectrometers, laser interferometers and ellipsometers are used to monitor selected fabrication processes appropriate for each type of sensor.

The present invention will be described with respect to using ellipsometer 20 to monitor and evaluate polysilicon plasma gate, bulk etching of semiconductor wafer 40. Semiconductor wafer 40 is preferably a thin slice from a single crystal of semiconductor material such as silicon. However, the present invention may be used with other types of semiconductor materials and is not limited to silicon.

Figure 1:
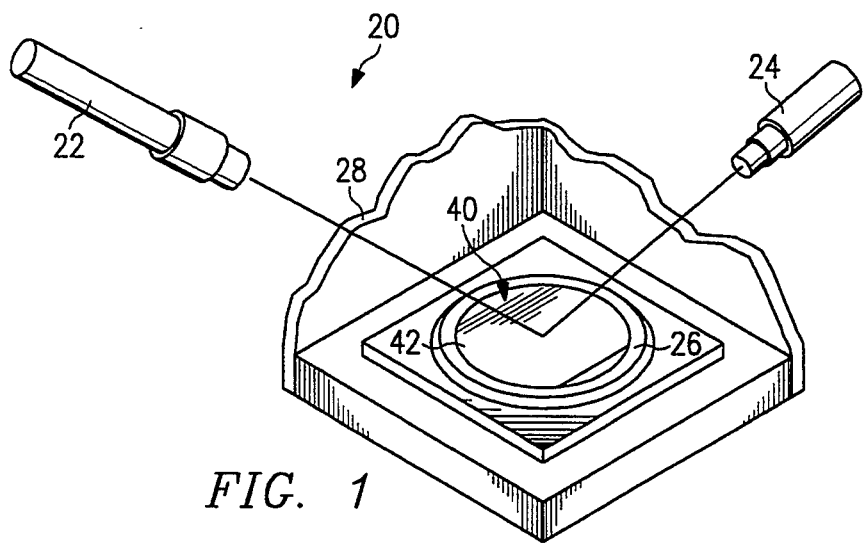
FIG. 1 is a schematic drawing showing portions of a reactor vessel and an ellipsometer system used in accordance with the present invention for monitoring and evaluating selected processes during fabrication of an integrated circuit on a semiconductor wafer.

As best shown in FIG. 1, semiconductor wafer 40 having a silicon substrate and one or more film layers is disposed on quartz pins 26 within reactor vessel or reagent chamber 28. Ellipsometer 20 includes laser light source 22 and analyzer 24. Reagent chamber 28 will preferably include two or more optical windows (not shown) to allow ellipsometer 20 to measure the thickness of a film layer or layers at selected site 44 on surface 42 of wafer 40. Reagent chamber 28 may include both an inner chamber (not shown) and an outer chamber.

Ellipsometer 20 measures changes in polarized light as the light is reflected and transmitted through thin film layers on surface 42 of semiconductor wafer 40. Ellipsometer 20 is preferably designed to calculate the thickness and index of refraction from a polysilicon layer every 0.5 seconds.

Figure 2:
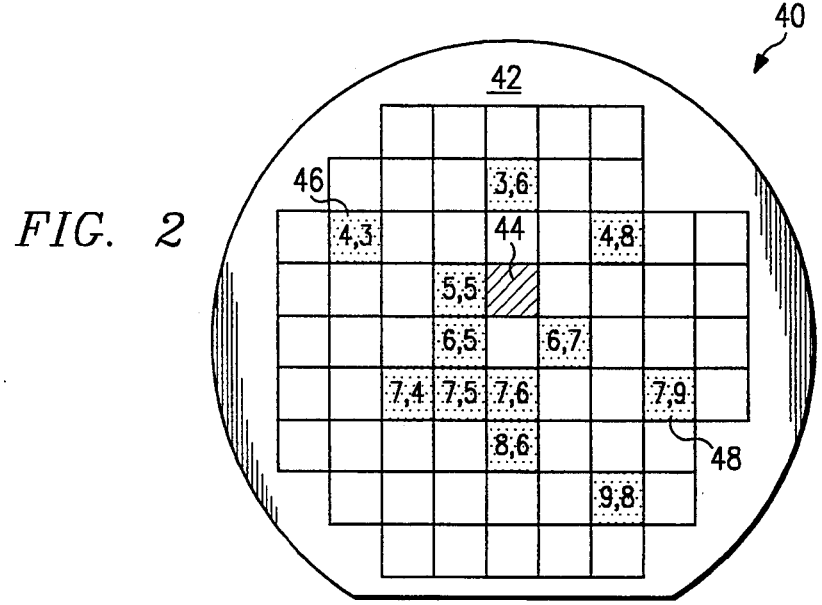
FIG. 2 is a schematic drawing showing dies and selected measurement sites on the surface of a semiconductor wafer.
Figure 3:
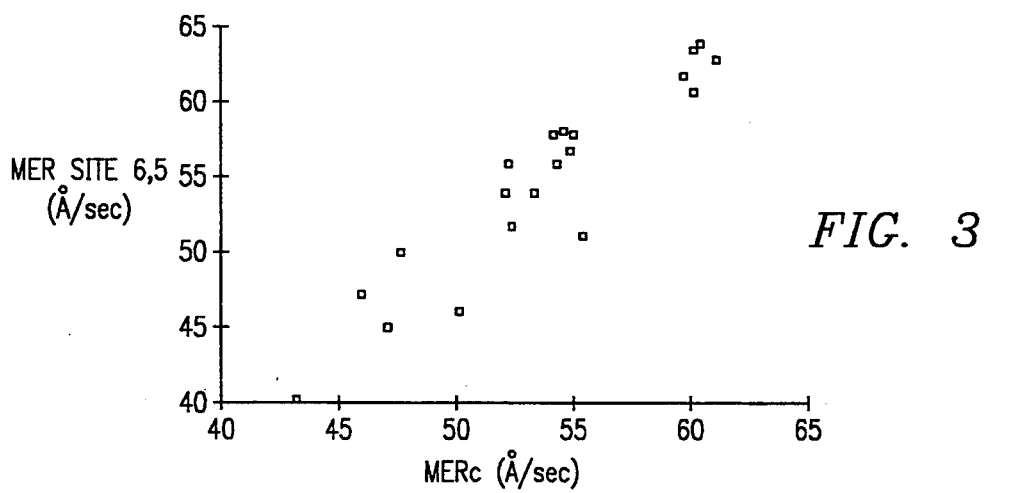
FIG. 3 is a graph showing the mean etch rate at a selected site on the semiconductor wafer surface of FIG. 2 in relationship to the mean etch rate measured at an ellipsometer site on the wafer surface.

As best shown in FIG. 2, surface 42 of semiconductor wafer 40 has been divided into approximately sixty-seven dies or potential sites for fabricating integrated circuits (not shown) on surface 42 of semiconductor wafer 40. Various lithography processes may be used to fabricate integrated circuits on wafer 40. Such integrated circuits are typically built in a series of layers on the respective dies on surface 42. The integrated circuits or portions of the integrated circuit may be fabricated on each die by processes such as etching or oxidation.

Ellipsometer 20 is preferably aligned to measure the thickness of a polysilicon film layer (not shown) on die 44. Die 44 may also be referred to by its coordinates (6,5), or as the ellipsometer site.

Presently available ellipsometry systems such as ellipsometer 20 are generally only capable of measuring film thickness over a relatively small sampling area. An in situ sampling site, such as die 44, provides no on-line capability to observe the thickness of the film layer at other locations on the surface of the semiconductor wafer. Therefore, previously available ellipsometer techniques do not allow in situ monitoring and evaluation of a fabrication process such as etching or oxidizing across the full surface 42 of semiconductor wafer 40.

This same limitation applies to many other sensors used for in situ monitoring of an integrated circuit fabrication process. The sensors are limited to providing information concerning only one area on the wafer surface.

The present invention provides a real time evaluation of a selected fabrication process such as etching at other locations such as die 46 (coordinate location 3,3) or die 48 (coordinate location 6,9). This evaluation can be obtained by statistically modelling each site on the surface of wafer 40 as a function of the etch rate measured at ellipsometer site or die 44. As will be explained later in more detail, the spatial model for each site will preferably include selected process conditions or control factors associated with the fabrication process which is being monitored by the sensor.

Etching thin films uniformly on surface 42 is a critical step to ensure high finished product yield from the fabrication process. Without uniform etching, too much material may be left at some sites on wafer 40 and other sites may be completely etched through the desired film layer with possible removal of underlying layers. An important requirement for success of the present invention is to develop a model of the mean etch rate at other locations on wafer surface 42 based on the etch rate measured at die 44 by ellipsometer 20. By developing a model for other locations on surface 42, a better evaluation may be made of the uniformity of the plasma etch process. After the etch rate at a plurality of sites on the wafer surface 42 has been modeled, the models may be optimized to achieve either a uniform distribution of etch rates across wafer surface 42 or a uniform remaining thickness across wafer surface 42.

Statistical modeling was developed for plasma etching of a single wafer such as semiconductor wafer 40 using in situ ellipsometry to infer real time etch rates at various locations across surface 42 of wafer 40 as a function of process conditions associated with the plasma etching process and the mean etch rate at the ellipsometer site. Statistical models describing the fabrication process as a function of process conditions or control factors use an empirical expression such as:

$$Y = C_0 + C_1 X_i + C_2 X_j + C_3 X_i^2 + C_4 X_j^2 + C_5 X_i \cdot X_j$$

to fit the measurable values using least squares regression. Y is the measurable response and $X_i$'s are the process conditions or control factors.

Statistically designed experiments were used to create spatial etch rate models at various sites such as dies 46 and 48. In situ mean etch rate information was collected at die 44 near the center of wafer 40 by ellipsometer 20. The mean etch rate at twelve additional locations including dies 46 and 44 was measured by off-line spectrophotometry. The twelve other locations are shown as shaded squares in FIG. 2.

Figure 4:
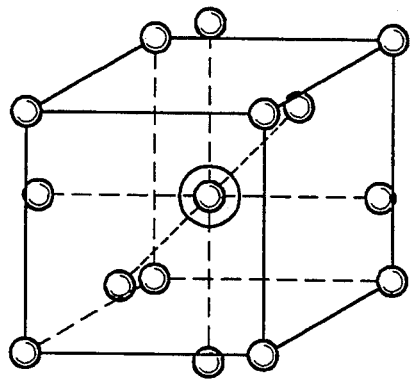
FIG. 4 is a schematic representation of the response surface methodology used to derive the empirical models for mean etch rate at selected sites on the wafer surface using experimental data such as shown by the graph of FIG. 3.

Response surface methodology was used to empirically derive the formula for mean etch rate at the other locations using process conditions or control factors and the mean etch rate measured by ellipsometer 20 as independent variables. A rotatable central composite design as represented by FIG. 4 was selected for three process conditions or control factors used to develop the model for mean etch rate at the other locations. For the bulk plasma etch process, the selected control factors were RF power, total pressure in reactor vessel 28 and total flow rate of reactants (HCl+HBr). To ensure statistical reliability twenty separate semiconductor wafers 40 were measured. For the plasma etch rate and reactor vessel 28 being evaluated the RF power ranged from 300 to 500 watts, the total pressure was varied between 200 and 400 mTorr, and total flow rate was varied between 75 and 175 SCCM.

As a result of this empirical modeling using response surface methodology and a polynomial equation with least squares regression, the following function was developed to represent the mean etch rate at other sites or locations on surface 42 of semiconductor wafer 40:

$MER_{other\ site} =$ $$C_0 + \Sigma\ C_i X_i + \Sigma\ C_{ii} X_i^2 + \sum_{i \neq j} C_{ij} X_{ij} + C_{n+1} MER_{ellips\ site}$$

MER=Mean Etch Rate
$X_i$=selected process factors
$C_i$=empirically derived constants Etch rate uniformity across surface 42 of semiconductor wafer 40 may be inferred by the distribution of the mean etch rate at the selected sites on surface 42.

Figure 5:
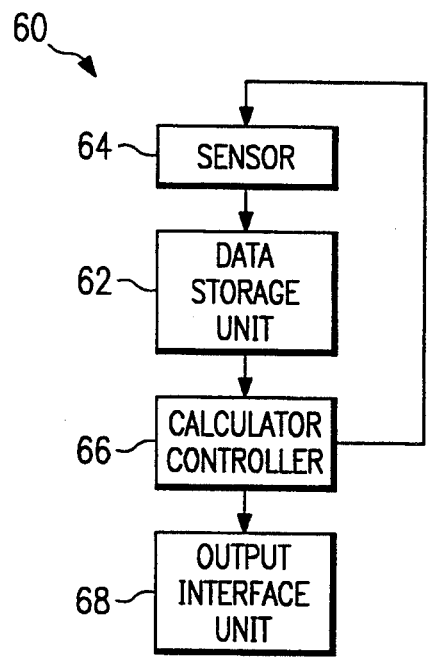
FIG. 5 is a functional block diagram showing a sensor, data storage unit, and calculator/controller for use with the present invention.

Control system 60 as shown in FIG. 5 may be used to monitor, evaluate and control the uniformity of the bulk etching process on semiconductor wafers 40. The empirical model for the mean etch rate at the other locations on surface 42 may be placed in data storage unit 62. Sensor 64 is used to measure the thickness of the film layer at site 44 and to provide this information to data storage unit 62. For purposes of control system 60 shown in FIG. 5, ellipsemeter 20 may function as sensor 64. As previously noted, various types of in situ sensors may be satisfactorily used with the present invention.

In addition to the mean etch rate models (first function) for the other sites on surface 42, calculator/controller 66 will also contain a second function for converting values of layer thickness measured by ellipsemeter 20 into the mean etch rate at ellipsemeter site 44. Calculator/controller 66 will then use the first function to derive the mean etch rate at the other locations on surface 42 of wafer 40 based on mean etch rate at ellipsemeter site 44 and the value of selected control factors such as RF power, total pressure and total flow rate of the reactants. A third function, similar to the second function, may be used to convert the mean etch rate at the other locations into thickness of the film layer at the other locations.

Calculator/controller 66 may be used to supply a signal to output interface unit 68. Output interface unit 68 may be used to indicate that the control factors or process conditions should be changed to obtain the desired results of the fabrication process at the other locations on surface 42. Calculator/controller 66 may also be used to provide a feedback signal to ellipsometer 20.

Figure 6:
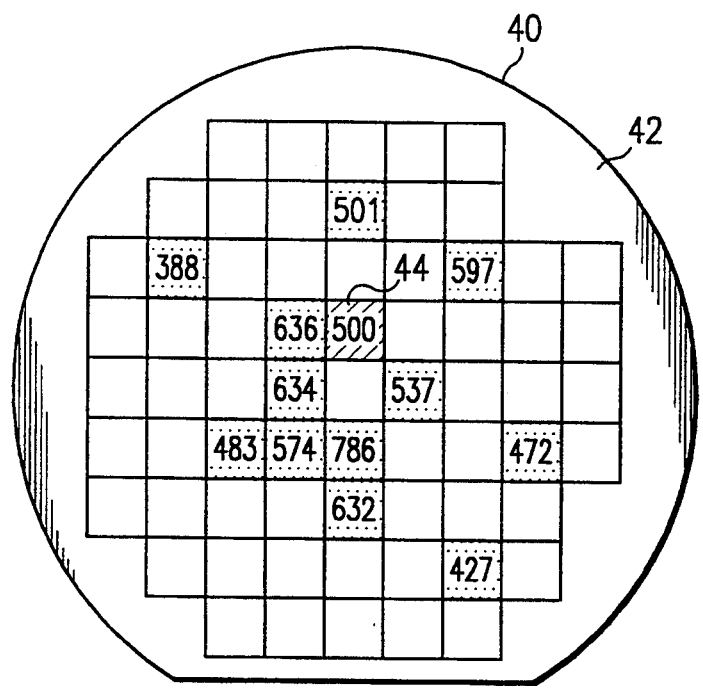
FIG. 6 is a schematic drawing showing the thickness at selected sites on the wafer surface as a result of etching the semiconductor wafer of FIG. 2 in accordance with the present invention.

FIG. 6 demonstrates the results of using the present invention to control the bulk etch rate on surface 42 of semiconductor wafer 40. By monitoring the thickness of the film layer at ellipsometer site 44 and by controlling the selected process conditions, RF power, total pressure and total flow rate of the reactants, a uniform thickness of $+/-300Å$ was obtained across surface 42. For the specific example shown in FIG. 6, the bulk etching process was stopped when ellipsometer 20 indicated a thickness of 500Å at ellipsometer site 44. The thickness of the film layer at the other sites on surface 42 was measured by off-line spectrophotometry and are shown by the numbers in the respective dies.

As a result of the present invention, control system 60 with appropriate empirical models (first function) for other locations on surface 42 may be used to enhance run by run process controls for reactor vessel 28 in the selected fabrication process. Control system 60 may be used to provide the end point for the selected fabrication process based on process conditions or control factors and information provided by in situ sensor 64 that measures the results of the fabrication process at one selected location on the wafer surface. Data storage unit 62 and calculator/controller 66 cooperate with each other by using a first function (empirical model for other locations on surface 42) to convert data from sensor 64 into projected results of the fabrication process at other locations on the surface 42.

The present invention allows control system 60 to evaluate and monitor the performance of reactor vessel 28 and its associated supporting systems (not shown) during the fabrication of integrated circuits on semiconductor wafer 40. Information supplied by output interface unit 68 allows the operator to adjust the control factors for the fabrication process which is being monitored and evaluated when inferred values at the other locations do not indicate the desired results. Control system 60 allows adjusting of the control factors to meet the desired target values for the fabrication process at the other sites on surface 42. Thus, the uniformity of the fabrication process on wafer-to-wafer runs within reactor vessel 28 may be enhanced.

By monitoring the film thickness in real time at site 44 and the selected control factors, the etching process may be stopped when the inferred values of mean etch rate at the other locations on surface 42 indicate that the desired amount of material has been removed. Alternatively, the etching process may be stopped when the inferred values of thickness at the other locations on surface 42 have been obtained.

The present invention also allows developing empirical models to accommodate semiconductor wafers which do not have a uniform thickness and/or reactor vessels which have unique patterns for reactivity within the vessel. For example, the film on the top half of semiconductor wafer 40 may be thicker than the film on the bottom half. Also, reactor vessel 28 may produce a bull's eye effect with enhanced reactivity at the center of surface 42 and less reactivity near the edges of surface 42. By developing a set of empirical models for the specific reactor vessel 28 and/or for the specific type of wafer 40, control factors may be selected to ensure that the fabrication process produces sites of uniform thickness despite these variations in the initial condition of semiconductor wafer 40 and/or in the characteristics of reactor vessel 28.

The present invention has been described with respect to plasma etching of polysilicon thin films. The methods and procedures have potential application for the etching of other films. In addition, the present invention may be used for the deposition or oxidation of films. In this approach the deposition rate would be modeled as a function of the process conditions and the mean deposition rate measured in situ by ellipsometer 44.

The present invention had been described with respect to in situ ellipsometry for single-point monitoring of etch rate. However, the modeling method is applicable for use with any sensor that provides real-time data. For example, the same methods and procedures may be used for modeling line width reduction during polysilicon etching using an in situ laser diffraction imaging system (not shown).

The previous written description has described the invention with respect to plasma etching of polysilicon their films and in situ ellipsometry. Those skilled in the art will readily appreciate that the present invention may be used with other semiconductor wafer fabrication processes and in situ sensors. Example of such other fabrication processes include, but are not limited to, thermal oxidation, diffusion of controlled impurities or dopants, ion implantation, chemical vapor deposition, lithography and dry etching. Examples of such in situ sensors include, but are not limited to interferometers, infrared spectroscopy, and laser interferometry. The invention has also been described with respect to silicon and silicon-based film. Those skilled in the art will readily note that the monitoring and evaluating system disclosed by this invention may also be used with other semiconductor materials such as gallium arsenide and germanium. Any semiconductor material or fabrication process will benefit from incorporating the monitoring and evaluating techniques resulting from this invention.

In addition to empirically-based modeling, physically-based modeling may be used to develop the first function for evaluating a selected fabrication process across surface 42 of wafer 40.

Although the present invention and its advantages have been described in detail, it should be understood that various changes, substitutions and alterations can be made therein without departing from the spirit and scope of the invention as defined by the appended claims.

What is claimed is:

1. A system for in situ evaluating a semiconductor wafer subjected to a selected process during the fabrication of an integrated circuit on the surface of the wafer comprising:
   a sensor for monitoring the results of the selected process during application of the selected process at one location on the wafer surface;
   a data storage system coupled to the sensor and operable to accumulate data output from the sensor representing the condition of the wafer at the one location on the wafer surface; and
   a calculation system operable to use a first function to convert the data measured at the one location into data showing projected results of the selected process at other locations on the wafer surface.

2. The system for evaluating a semiconductor wafer as defined in claim 1 wherein:
   the sensor comprises an ellipsometer operable to measure the thickness of a film layer at the one location on the semiconductor wafer;
   the calculation system further operable to use a second function to convert the thickness of the film layer measured at the one location into the mean etch rate at the one location; and
   the first function operable to convert the mean etch rate at a the one location into the mean etch rate at the other locations on the wafer surface.

3. The system for evaluating a semiconductor wafer as defined in claim 1 wherein the first function comprises a polynomial equation using least squares regression and the mean etch rate measured at the one location.

4. The system for evaluating a semiconductor wafer as defined in claim 1 further comprising the calculating system indicating a desired end point for the selected process at a selected location on the wafer surface by using the first function.

5. The system for evaluating a semiconductor wafer as defined in claim 1 further comprising a plurality of other locations on the wafer surface selected to empirically develop a spatial model using response surface methodology to provide a real time evaluation of the selected process at the other locations on the wafer surface.

6. The system for evaluating a semiconductor wafer as defined in claim 1 further comprising a control system for stopping the selected process when a desired end point has been reached based on the projected results of the selected process at the other locations on the wafer surface.

7. A method for monitoring and evaluating a semiconductor wafer during a selected fabrication process on the wafer surface comprising the steps of:
   monitoring the results of the selected fabrication process at one location on the wafer surface with an in situ sensor during application of the selected fabrication process;
   storing information from the sensor representing the condition of the wafer at the one location at the wafer surface in a data storage unit and providing a signal to a calculation system;
   converting the stored information using a first function to infer results of the selected fabrication process at other locations on the wafer surface; and
   providing a signal based on the inferred results to an output interface unit for use in controlling the selected fabrication process.

8. The method of monitoring and evaluating a semiconductor wafer as defined in claim 7 further comprising the steps of:
   measuring the thickness of a film layer at the one location on the wafer surface with an ellipsometer;
   converting the thickness of the film layer measured at the one location into the mean etch rate at the one location using a second function;
   converting the mean etch rate at the one location into an inferred mean etch rate at other locations on the wafer surface using the first function; and converting the mean etch rate at the other locations on the wafer surface into thickness of the film layer at the other locations using a third function.

9. The method of monitoring and evaluating a semiconductor wafer as defined in claim 7 further comprising the steps of:
measuring the results of the selected fabrication process at other locations on the wafer surface; and
modeling the results of the other locations using results at the one location and selected process conditions to develop the first function, 10. The method of monitoring and evaluating a semiconductor wafer as defined in claim 7 further comprising the step of using response surface, methodology and a polynomial equation with least squares regression to develop the first function.

11. The method of monitoring and evaluating a semiconductor wafer as defined in claim 7 further comprising the steps of:
comparing the inferred results of the selected fabrication process at the other locations on the wafer surface with desired results at the other locations; and
stopping the selected fabrication process when the inferred results are within acceptable limits established for the desired results, 12. The method of monitoring and evaluating a semiconductor wafer as defined in claim 7 further comprising the steps of:
calculating the mean etch rate at a plurality of other locations on the semiconductor wafer surface; and
optimizing the resulting models to provide a desired result from the selected fabrication process across the wafer surface.

13. The method of monitoring and evaluating a semiconductor wafer as defined in claim 7 wherein the process conditions selected for the first function comprise RF power, total pressure in the reagent chamber, and total flow rate of the reactants.

14. A system for in situ evaluating a semiconductor wafer subjected to an etching process during the fabrication of an integrated circuit on the surface of the wafer comprising:
a sensor for monitoring thickness of a film layer at one location on the wafer surface during application of the etching process;
a data storage system coupled to the sensor and operable to accumulate data output from the sensor representing the thickness of the film layer at the one location on the wafer surface; and
a calculation system operable to use a first function for converting the film thickness at the one location into data showing projected results of the etching process at other selected locations on the wafer surface.

15. The system for evaluating a semiconductor wafer as defined in claim 14 and wherein:
the sensor comprises an ellipsometer operable to measure the thickness of the film layer at the one location on the semiconductor wafer;
the calculation system further operable to use a second function to convert the thickness of the film layer measured at the selected ellipsometer site into the mean etch rate at the selected ellipsometry site; and
the first function operable to convert the mean etch rate at a the selected ellipsometry site into the mean etch rate at the other selected locations on the wafer surface.

16. The system for evaluating a semiconductor wafer as defined in claim 14 wherein the first function comprises a polynomial equation using least squares regression and the mean etch rate measured at the selected ellipsometry site.

17. The system for evaluating a semiconductor wafer as defined in claim 14 wherein:
the etching process further comprises a HCl and HBr plasma; and
the semiconductor wafer further comprises a polysilicon film layer on the wafer surface.

18. The system for evaluating a semiconductor wafer as defined in claim 14 further comprising a control system for stopping the etching process when a desired end point has been reached based on the projected results of the etching process at the other locations on the wafer surface.

19. A system for in situ evaluating a semiconductor wafer subjected to a selected process during the fabrication of an integrated circuit on the surface of the wafer comprising:
a sensor for monitoring the results of the selected process during application of the selected process at one location on the wafer surface;
a data storage system coupled to said sensor and operable to accumulate data output from said sensor representing the condition of the wafer at said one location on the wafer surface;
a calculation system operable to use a first function to convert said data measured at said one location into data showing projected results of the selected process at other locations on the wafer surface;
said sensor being operable to measure thickness of a film layer at said one location on the semiconductor wafer;
said calculation system further operable to use a second function to convert said thickness of said film layer measured at said one location into a mean rate at said one location;
said first function operable to convert said mean rate at a the one location into a mean rate at another location on the wafer surface; and
an output interface operable to control the selected process at least in part based on said mean rate at said other location.

20. The system for evaluating a semiconductor wafer as defined in claim 19 wherein said first function comprises a polynomial equation using least squares regression and said mean rate measured at said one location.

21. The system for evaluating a semiconductor wafer as defined in claim 19 further comprising said calculating system indicating a desired end point for the selected process at said other location on the wafer surface by using said first function.

22. The system for evaluating a semiconductor wafer as defined in claim 19 further comprising a plurality of other locations on the wafer surface selected to empirically develop a spatial model using response surface methodology to provide a real time evaluation of the selected process at said other locations on the wafer surface.

23. The system for evaluating a semiconductor wafer as defined in claim 19 further comprising a control system for stopping the selected process when a desired end point has been reached based on projected results of the selected process at said other location on the wafer surface.

* * * * *